United States Patent [19]

Freitas

[11] Patent Number: 5,025,179
[45] Date of Patent: Jun. 18, 1991

[54] ECL CLAMPED CUTOFF DRIVER CIRCUIT

[75] Inventor: Oscar W. Freitas, Portland, Me.

[73] Assignee: National Semiconductor Corporation, Santa Clara, Calif.

[21] Appl. No.: 407,544

[22] Filed: Sep. 15, 1989

[51] Int. Cl.5 .................... H03K 19/86; H03K 5/12; H03K 3/01
[52] U.S. Cl. .................................. 307/455; 307/456; 307/263; 307/270; 307/549; 307/555; 307/557; 307/558; 307/491
[58] Field of Search ........ 307/443, 549, 555, 557-558, 307/250, 263, 270, 454-456, 491

[56] References Cited

U.S. PATENT DOCUMENTS 4,877,977 10/1989 Kokado .............................. 307/455

Primary Examiner—Stanley D. Miller
Assistant Examiner—Margaret Rose Wambach
Attorney, Agent, or Firm—Lee Patch; Daniel H. Kane

[57] ABSTRACT

An ECL cutoff driver circuit for an ECL gate coupled between ECL high and low potential power rails includes a cutoff clamp circuit. The ECL gate with differential signal inputs and at least one output node is coupled for delivering ECL logic output signals of high and low potential levels during operation of the ECL gate in a switching mode. The cutoff driver circuit includes cutoff transistor elements for shifting down the ECL output at least to a maximum specified cutoff potential level below the ECL logic low potential level in a cutoff state. The cutoff clamp circuit is coupled between the ECL high potential power rail and the output node or output nodes for clamping the ECL output at a minimum or lower bound voltage level substantially at the specified cutoff voltage level $V_{OLZ}$. This prevents output buffer transistor elements from being completely turned off for faster return of the ECL gate from the cutoff state to operation in the switching mode. The clamp circuit references the clamp voltage level to the ECL high potential power rail and is substantially independent of the current level in the cutoff clamp circuit.

26 Claims, 3 Drawing Sheets

ECL CLAMPED CUTOFF DRIVER CIRCUIT

TECHNICAL FIELD

This invention relates to a new cutoff driver circuit for ECL output gates useful for applications in which multiple ECL output gates are coupled to a common bus. In common bus applications one ECL output gate may be in the active switching mode while the others are held in the cutoff state. The present ECL cutoff driver circuit invention speeds return of an ECL output gate from the cutoff state to the active switching mode.

BACKGROUND ART

A conventional temperature compensated ECL differential output gate with cutoff driver circuit is illustrated in FIG. 1. The basic ECL output gate, also referred to herein as an ECL gate and an ECL differential gate, is provided by the gate transistor elements Q5 and Q6. In this example gate transistor element Q5 provides a direct input transistor element for receiving ECL logic input signals of ECL logic high and low potential levels at the direct input SX. Gate transistor element Q6 provides an inverted input transistor element to which an ECL logic inverted input signal is applied at the inverted signal input SXN. Alternatively gate transistor element Q6 may provide a reference transistor element to which a reference voltage signal is applied at an intermediate reference voltage level between the ECL logic input signal high and low potential levels. Either arrangement is referred to herein as an ECL gate, ECL differential gate or ECL output gate.

The emitter nodes of ECL gate transistors Q5 and Q6 are coupled together at a common emitter node coupling E1. Current sink I1 is coupled in a circuit between the common emitter node coupling E1 and the ECL low potential power rail designated $V_{EE}$. The voltage level of the low potential power rail $V_{EE}$ is typically $-4.2$ v to $-4.8$ v. In the example of FIG. 1 the output enable gate transistor element Q7 and resistor element R4 are coupled between the ECL gate common emitter node coupling E1 and current sink I1 effectively forming a cutoff current sink switch as hereafter described.

The current sink I1 is provided by a current source transistor element Q13 with a tail resistor element R5 in its emitter current path for generating the sink current or tail current. A bias voltage generator, not shown, provides the current source voltage $V_{CS}$ applied to the base of the current source transistor element Q13 of the current sink I1. The current source voltage level $V_{CS}$ is selected typically to be for example, 1.32 v above the low potential power rail $V_{EE}$.

The ECL differential gate transistor elements Q5 and Q6 provide alternative current paths through respective collector path swing voltage resistor elements R1 and R2 which are in turn coupled to the ECL high potential power rail $V_{CC}$. The ECL high potential power rail $V_{CC}$ is, for example, at ground potential 0v, also designated GND. Typically the swing voltage resistor elements R1 and R2 have substantially equal resistance. Current sink I1 generates the ECL differential gate current in one of the alternative current paths through either of the swing resistor elements R1 or R2 according to the differential input signals at the complementary inputs SX and SXN at the respective base nodes of ECL gate transistor elements Q5 and Q6.

As further shown in FIG. 1 the ECL gate differential or complementary output signals are derived from the respective collector nodes of ECL gate transistor elements Q5 and Q6. The collector nodes are output switching nodes which provide output signals of high and low potential through respective output buffer emitter follower transistor elements Q1 and Q4 at the respective differential and complementary outputs QXN and QX. The collector node of ECL gate transistor element Q6 through output buffer emitter follower transistor element Q4 provides the true output signal QX for an input signal SX at the base node of gate transistor element Q5. Conversely, the collector node of gate transistor element Q5 through output buffer emitter follower transistor element Q1 provides the inverted output signal QXN for an inverted input signal SXN at the base node of gate transistor element Q6.

Output buffer emitter follower transistor elements Q1 and Q4 are coupled respectively at the collector nodes to a separate ECL high potential power rail or output power rail $V_{CCA}$. The external or output high potential power rail $V_{CCA}$ may be relatively isolated from the internal high potential power rail $V_{CC}$ to isolate the internal circuits from power rail noise perturbations on the output power rails due to switching events on the common bus. The emitter terminals of emitter follower transistor elements Q1 and Q4 are also typically terminated through respective terminating resistors RT at terminating voltage level $V_{TT}$ of, for example, $-2.0$ v. The ECL logic high and low potential levels at complementary outputs QX and QXN are therefore established between the ground potential 0 v at the ECL high potential power rail $V_{CC}$ and the terminating voltage $-2.0$ v at the terminating voltage source $V_{TT}$ according to the voltage drop and voltage swing across swing resistors R1 and R2. This is in turn set by the size of the swing resistors and of the sink current generated by current sink I1.

The conventional cutoff driver circuit for the ECL output gate is provided by, in this example, first and second output enable (OE) differential gates. The first OE differential gate includes the OE transistor element Q12 and cutoff transistor elements Q10 and Q11 all coupled together at a common emitter node coupling E2. A second current sink I2 is coupled between the common emitter node coupling E2 of the OE differential gate transistor elements Q10, Q11 and Q12 and the ECL low potential power rail $V_{EE}$. Current sink I2 is provided by current source transistor element Q14 and tail resistor R6. The current source voltage $V_{CS}$ provides the base drive for the current source transistor element Q14. An output enable input signal OE is applied at the base node of OE transistor element Q12 while the complementary or inverted output enable signal OEN is applied at the base nodes of cutoff transistor elements Q10 and Q11.

The collector terminal of OE transistor element Q12 is coupled directly to the ECL high potential power rail $V_{CC}$ for supplying current sink I2 when OE transistor element Q12 is conducting during normal switching mode operation. The collector node of one of the cutoff transistor elements Q10 is coupled to swing resistor R1 at the collector node of ECL gate input transistor element Q5, while the collector node of the other cutoff transistor element Q11 is coupled to the swing resistor element R2 at the collector node of the ECL gate complementary input transistor element Q6. In this way the voltage drop across swing resistor elements R1 and R2 may be increased by the tail current generated by current sink I2 when cutoff transistor elements Q10 and Q11 are conducting in the cutoff state.

The second OE differential gate is provided by OE transistor element Q7 and cutoff transistor elements Q8 and Q9 coupled together at a third common emitter node coupling E3. The first current sink I1 is coupled between the common emitter node coupling E3 of OE differential gate transistor elements Q7, Q8 and Q9 and the low potential power rail $V_{EE}$. The output enable input signal OE is applied at the base node of OE transistor element Q7 while the complementary or inverse output enable signal OEN is applied at the common base node coupling of cutoff transistor elements Q8 and Q9. In this manner when cutoff transistor elements Q8 and Q9 are conducting, the voltage drop across swing resistor elements R1 and R2 may be increased by the sink current or tail current generated by current sink I1 when the cutoff transistor elements Q8 and Q9 are conducting in the cutoff state.

When OE transistor element Q7 is conducting the ECL gate current flows through either of the ECL gate transistor element collector paths defined by swing resistor elements R1 and R2. The current requirements of the first current sink I1 are therefore satisfied through the ECL gate. The OE transistor element Q7 in combination with parallel resistor element R4 provides an effective current switch between the first common emitter node coupling E1 of the ECL differential gate and the common emitter node coupling E3 of the second OE differential gate. When OE transistor element Q7 is not conducting the first current sink I1 is effectively disconnected from the ECL output gate.

During normal switching operation of the ECL output gate, the output enable input signal OE is at high potential and the OE transistor elements Q7 and Q12 are conducting. The complementary output enable signal OEN is at low potential and the cutoff transistor elements Q8, Q9, Q10 and Q11 are off. OE transistor element Q12 satisfies the tail current requirements for current sink I2 while OE transistor element Q7 connects current sink I1 to the ECL output gate for normal switching operation between ECL logic high and low potential levels at the complementary inputs SX and SXN and the complementary outputs QX and QXN.

For the cutoff state, the output enable signal OE is at low potential and the complementary output enable signal OEN is at high potential. As a result OE transistor elements Q7 and Q12 are relatively non-conducting while the cutoff transistor elements Q8, Q9, Q10 and Q11 are conducting current through swing resistor elements R1 and R2 in order to satisfy the relatively large current requirements of current sinks I1 and I2. The total sinking current of current sinks I1 and I2 is therefore forced through the swing resistor elements or load resistor elements R1 and R2. The abnormally large current causes a large voltage drop across swing resistor elements R1 and R2. The output voltage level at the respective emitter node ECL outputs QXN and QX of output buffer emitter follower transistor elements Q1 and Q4 is shifted down to a cutoff potential level $V_{OLZ}$ below the ECL logic signal low potential level $V_{OL}$ and approaching the load termination voltage $V_{TT}$ of, e.g. −2.0 v. The complementary ECL outputs QX and QXN are therefore held at the cutoff potential level $V_{OLZ}$ analogous to the high impedance third state, for applications with multiple ECL output gates on a common bus.

One disadvantage of the conventional ECL output gate cutoff driver circuit is that the temperature compensation for the ECL logic high and low potential levels $V_{OH}$ and $V_{OL}$ operative during normal switching mode operation of the ECL gate is ineffective and inoperative during the cutoff state. Temperature compensation at the ECL gate is effected by the triplet circuit or crossover network provided by base collector shorted (BCS) diode transistor elements Q2 and Q3 and resistor element R3 coupled between the collector nodes of ECL gate transistor elements Q5 and Q6. The temperature compensating network Q2, Q3, R3 is operative over the desired temperature range for the ECL logic high and low potential levels $V_{OH}$ and $V_{OL}$ during normal switching mode operation when the current generated by current sink I2 flows through OE transistor element Q12. When the sinking current generated by current sink I2 flows through cutoff transistor elements Q10 and Q11 and swing resistor elements R1 and R2 during the cutoff state, temperature compensation is not achieved.

With increasing temperature, the negative temperature coefficient of the base emitter junctions cause $V_{BE}$'s to decrease. This increases the sink current generated by the current sinks and in turn increases the voltage drop across the swing resistors R1 and R2. At hot temperatures the capacitance across all components increases also. In the non-cutoff state, that is in the normal switching mode operation of the ECL gate, the positive temperature coefficient of the swing resistors may substantially compensate for the negative temperature coefficient of the $V_{BE}$'s as temperature increases.

In the cutoff state however the current through the ECL swing resistor elements R1 and R2 is exaggerated. The positive temperature coefficient of the resistors no longer provides substantial compensation at high temperature. The extra current, increasing the voltage drop across swing resistors R1 and R2 pulls down the outputs QX and QXN below the desired cutoff potential level $V_{OLZ}$, of for example −1.95 v, to a deeper cutoff condition for example approaching the terminating voltage $V_{TT}$. It therefore takes longer to return from the cutoff state to the normal switching mode operation range between $V_{OL}$ and $V_{OH}$.

This problem presented by the prior art ECL gate cutoff driver circuit is a problem caused by operation of the circuit in the hot temperature operating range and in the cutoff state when there is additional current passing through the ECL gate swing resistor elements. Not only is there a delay in the start of transition from the cutoff state to a valid ECL logic high or low potential level but also a decrease in the slope of the transition for an overall total delay in both starting and switching, and a net slowdown in the operation of the ECL gate.

For a typical ECL gate coupled between the ECL high and low potential level power rails $V_{CC}$ and $V_{EE}$ as set forth above, the temperature compensated ECL logic high and low potential levels $V_{OH}$ and $V_{OL}$ are for example −0.95 v and −1.70 v respectively. The room temperature cutoff voltage level $V_{OLZ}$, is set approximately at −1.95 v approaching the terminating voltage $V_{TT}$ of −2.0 v, but slightly above. As a result the emitter follower output buffer transistor elements Q1 and Q4 at room temperature are slightly on. This reduces propagation delay in return of the outputs QX and QXN from the cutoff potential level $V_{OLZ}$ in the cutoff state to one of the valid ECL logic high and low potential levels $V_{OH}$, $V_{OL}$ in the switching mode. Without temperature compensation in the cutoff state however, the emitter follower output buffer transistor elements Q1 and Q4 may turnoff completely. The downward drift of $V_{OLZ}$ with increasing temperature poses no problem for the DC cutoff condition. But, for transient AC switching and return to the switching mode, undesirable propagation delay or "step out" is introduced in the high temperature operating range.

This undesirable delay in going from the cutoff state to high and low transitions at high temperature in comparison to room temperature is illustrated in FIG. 2. In this example the transition of the complementary output enable signal OEN from high potential in the cutoff state to low potential in the normal switching mode is followed by comparative transitions at the respective complementary outputs QX and QXN to ECL logic high and low potential levels. The transitions at the respective outputs QX and QXN are substantially delayed at high temperature in comparison to room temperature.

OBJECTS OF THE INVENTION

It is therefore an object of the present invention to provide a new ECL differential gate with cutoff driver circuit having improved speed of operation and in particular increased speed of transition to valid ECL logic high and low potential levels at the output from the cutoff state. It is an object of the invention to reduce the delay in the start of transition and increase the slope and speed of transition at the output from the cutoff state to ECL logic high and low potential levels.

Another object of the invention is to provide a cutoff driver circuit for ECL gates which avoids shifting down the voltage levels at the outputs to a deep cutoff state and causing the output buffer transistor elements to be non-conducting. The invention holds the ECL output buffer transistor elements slightly on for fast return at the output from the cutoff state to the normal switching mode.

A further object of the invention is to provide a cutoff driver clamp circuit for ECL gate cutoff driver circuits which maintains specified minimum clamp voltage levels substantially independent of current flowing through the clamp circuit over the operating temperature range.

DISCLOSURE OF THE INVENTION

In order to accomplish these results the invention provides an ECL cutoff driver circuit for an ECL gate coupled between ECL high and low potential power rails with differential input first and second gate transistor elements and at least one output node at a collector node of one of the first and second gate transistor elements. The output node is coupled to an ECL output for delivering ECL output signals of high and low potential levels $V_{OH}$ and $V_{OL}$ during operation of the ECL gate in a switching mode. The cutoff driver circuit causes voltage shift down at the ECL output at least to a maximum cutoff potential level $V_{OLZ}$ below the ECL low potential level $V_{OL}$ in a cutoff state.

According to the invention a cutoff clamp circuit is operatively coupled between the ECL high potential power rail and the output node for clamping the ECL output at a minimum voltage level substantially at the specified cutoff voltage level $V_{OLZ}$ during the cutoff state. A feature and advantage of this arrangement is that the cutoff clamp circuit assures fast return of the ECL gate to operation in the switching mode and maintains a desired speed of transition at the output from the cutoff potential level $V_{OLZ}$ to the ECL logic high and low potential levels $V_{OH}$ and $V_{OL}$ across the desired operating temperature range.

In the preferred example the cutoff clamp circuit includes a clamp resistor element and a clamp current sink operatively coupled in series between the ECL high and low potential power rails. The clamp current sink generates a constant sink current and therefore a substantially constant voltage drop across the clamp resistor element. The clamp circuit further includes a voltage downshift element coupled in series with the clamp resistor element between the ECL high potential power rail and the output node. The voltage downshift element is provided, for example, by the base emitter junction, with voltage drop $V_{BE}$, of a clamp transistor element or a diode junction.

According to the best mode of the invention, the clamp resistor element is coupled as an emitter follower transistor element for low impedance matching and delivery of the current requirements of the cutoff driver circuit current sinks during the cutoff state. Thus, as the voltage level at the output node drops during the cutoff state, the emitter follower clamp transistor element displaces current from the swing resistors in the collector current paths of the ECL gate transistor elements. The voltage level of the output node is thereby clamped at the specified clamp voltage level $V_{CL}$.

In the case of an ECL gate with complementary output nodes at the respective collector nodes of the first and second gate transistor elements, the complementary outputs nodes are coupled respectively through first and second emitter follower output buffer transistor elements to differential or complementary ECL outputs. The cutoff clamp circuit according to the invention then provides first and second cutoff clamp circuit branches respectively coupled between the ECL high potential power rail and the complementary output nodes for clamping both the complementary ECL outputs substantially at the minimum voltage level $V_{OLZ}$ in the cutoff state.

The cutoff clamp uses the clamp resistor element and clamp current sink coupled in series between the ECL high and low potential power rails. The constant current generated by the clamp current sink establishes a substantially constant voltage drop across the clamp resistor element. The first clamp circuit branch comprises a first voltage downshift element coupled in series with the clamp resistor element between the ECL high potential power rail and one of the complementary output nodes. The second clamp circuit branch is provided by a second voltage downshift element coupled in series with the clamp resistor element between the ECL high potential power rail and the other of the complementary output nodes. The voltage downshift elements are provided in the preferred example by the base emitter junctions, with voltage drops $V_{BE}$, of first and second emitter follower clamp transistor elements.

According to the preferred example embodiments the values of the clamp resistor element and voltage downshift elements are selected so that the cutoff voltage levels $V_{OLZ}$ at the respective complementary ECL outputs QX and QXN are slightly greater than the terminating voltage $V_{TT}$. The output nodes V1 and V2 at the respective collector nodes of the gate transistor elements are therefore preferably clamped at approximately $1V_{BE}$ above the desired cutoff output voltage level $V_{OLZ}$.

The clamped cutoff driver circuit according to the invention provides a clamped voltage level at the output nodes V1 and V2 referenced to the ECL high potential power rail $V_{CC}$. As a result the clamped voltage level referenced to $V_{CC}$ at the ECL gate output nodes V1 and V2 is equal to $V_{CC} - V_{R7} - V_{BE}$, and $V_{OLZ}$ is clamped at a voltage level slightly greater than the terminating voltage $V_{TT}$.

DESCRIPTION OF PREFERRED EXAMPLE EMBODIMENTS AND BEST MODE OF THE INVENTION

Figure 1:
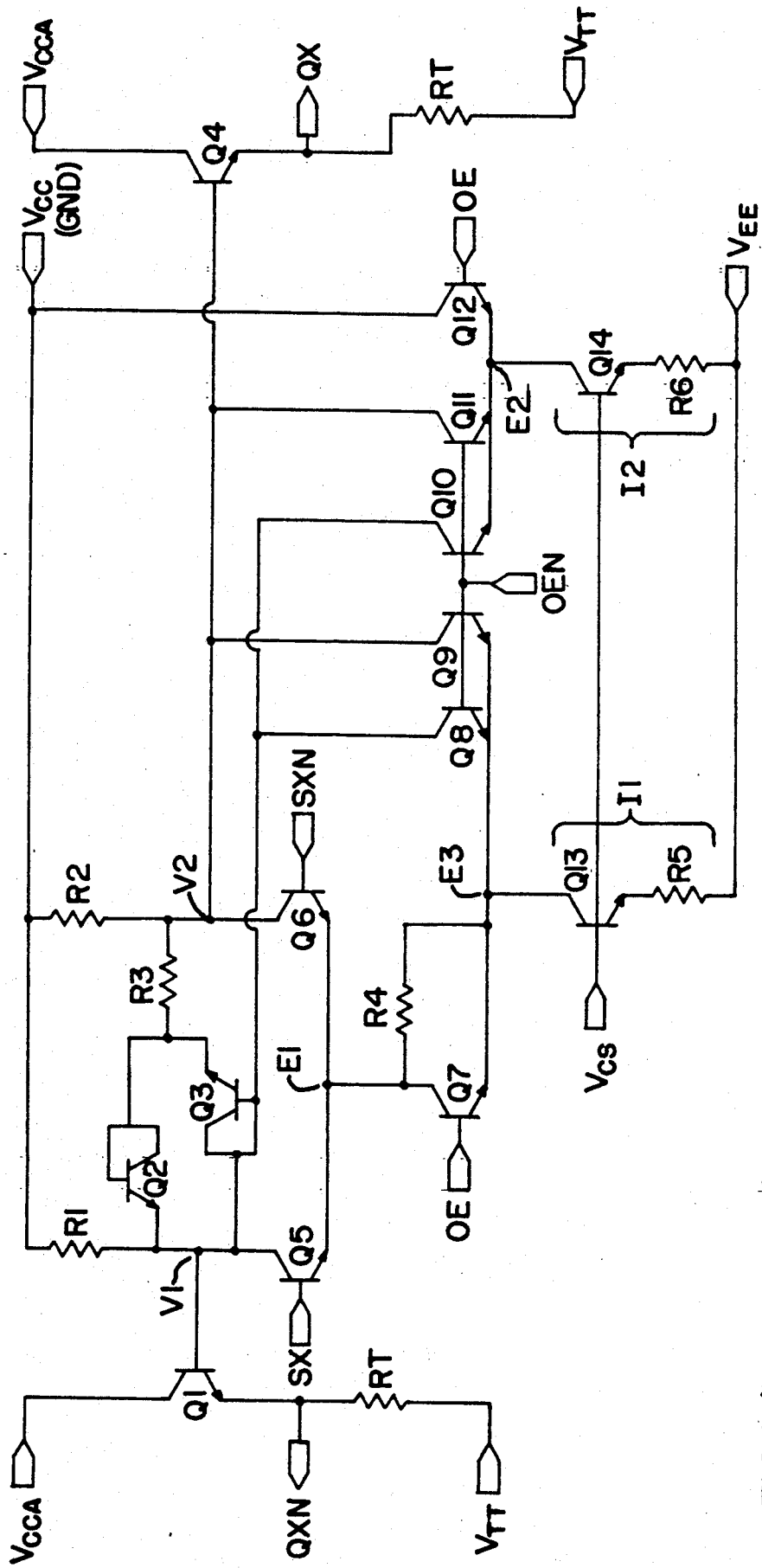
FIG. 1 is a schematic circuit diagram of a prior art ECL differential gate with cutoff driver circuit.
Figure 3:
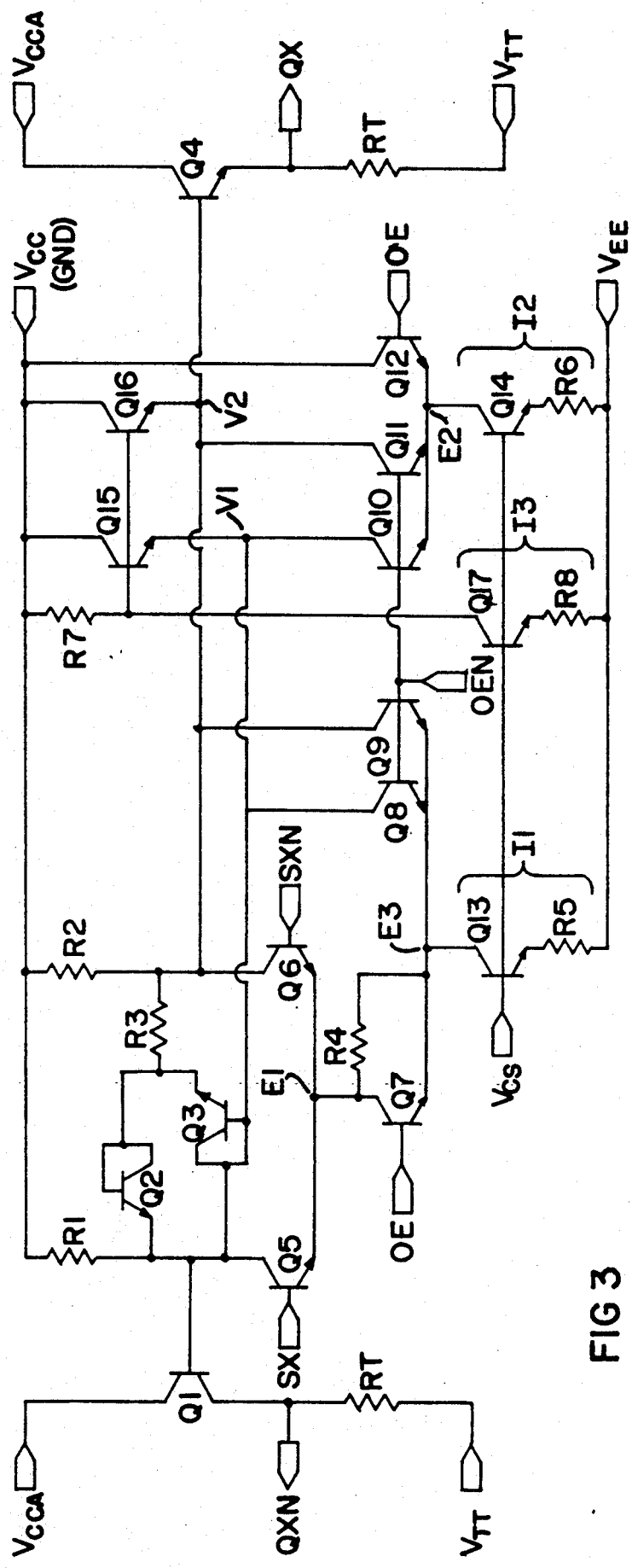
FIG. 3 is a schematic circuit diagram of an ECL differential gate with clamped cutoff driver circuit in accordance with the invention.

An ECL differential gate with clamped cutoff driver circuit according to the invention is illustrated in FIG. 3. The circuit components which perform the same or similar function described with reference to FIG. 1 are indicated by the same reference numeral or reference designation. In addition to the circuit elements of FIG. 1, however, there is added a cutoff clamp circuit provided by transistor elements Q15, Q16 and Q17 and resistor elements R7 and R8. The cutoff clamp circuit establishes minimum voltage levels or lower bounds for the voltage at switching output nodes V1 and V2. Output nodes V1 and V2 coincide respectively with the collector nodes of the ECL gate transistor elements Q5 and Q6 and with the base nodes of output emitter follower output transistor elements Q1 and Q4. The cutoff clamp circuit establishes the clamp voltage level at output nodes V1 and V2 as hereafter described with reference to the ECL high potential rail $V_{CC}$.

The cutoff clamp circuit includes a clamp resistor element R7 and a clamp current sink I3 coupled in series between the ECL high and low potential power rails $V_{CC}$ and $V_{EE}$. The current sink I3 constitutes a third current sink in the ECL gate and cutoff driver circuit and generates a substantially constant current and therefore a substantially constant voltage drop $V_{R7}$ across the clamp resistor element R7 for stable operation of the clamp circuit. The current sink I3 is provided by current source transistor element Q17, tail resistor R8, and current source voltage $V_{CS}$ applied to the base terminal of current source transistor element Q17. The current source voltage $V_{CS}$ is a temperature compensated voltage supply from a band-gap bias generator, not shown, and is typically set at, for example 1.32 v above the ECL low potential power rail voltage $V_{EE}$.

The cutoff clamp circuit is completed by clamp transistor elements Q15 and Q16 which provide first and second clamp circuit branches coupled in series with clamp resistor element R7 between the ECL high potential power rail $V_{CC}$ and the respective complementary output nodes V1 and V2. As shown in FIG. 3 the clamp transistor elements Q15 and Q16 are coupled in emitter follower configuration with base emitter junctions coupled in parallel between the clamp resistor element R7 and the respective output nodes V1 and V2. Thus, clamp transistor element Q15 provides a first base emitter junction in series with clamp resistor element R7 between the ECL high potential power rail and the first switching output node V1 which coincides with the collector node of ECL gate transistor element Q5. Clamp transistor element Q16 provides a base emitter junction in series with clamp resistor element R7 between the ECL high potential power rail and the second switching output node V2 which coincides with the collector node of ECL gate transistor element Q6.

The first and second branch circuits of the cutoff clamp circuit therefore clamp the voltage level at output nodes V1 and V2 at a clamping voltage level $V_{CL}$ referenced to the ECL high potential power rail as follows:

$$V_{CL} = V_{CC} - V_{R7} - V_{BE}$$

Because of the cutoff clamp circuit arrangement, the clamp voltage level $V_{CL}$ is substantially independent of the current flowing through the clamp circuit when the clamp circuit is operating. This clamp circuit current flows through the collector to emitter paths of the respective clamp transistor elements Q15 and Q16 coupled in emitter follower configuration. The independent sink current generated by the clamp current sink or third current sink I3 remains substantially constant maintaining a substantially constant voltage drop across clamp resistor R7. The voltage drop $V_{BE}$ across the respective base emitter junctions of clamp transistor elements Q15 and Q16 similarly remains substantially constant with only a small dependence on current level through the transistor elements.

The desirable level for the clamping voltage $V_{CL}$ at output nodes V1, V2 according to the invention is analyzed as follows. The complementary outputs QX and QXN are terminated through respective terminating resistor elements RT to terminating voltage source $V_{TT}$, with the terminating voltage source $V_{TT}$ being selected for example at $-2.0$ v. With a cutoff voltage level $V_{OLZ}$ at the complementary outputs QX and QXN equal to $V_{TT}$, the output buffer emitter follower transistor elements Q1 and Q4 are entirely turned off. This results in some delay in return of the outputs QX and QXN from the cutoff state to the switching mode and turn on of the output transistor elements Q1 and Q4 for transition from the cutoff voltage level $V_{OLZ}$ to ECL logic high and low potential levels $V_{OH}$ and $V_{OL}$. $V_{OH}$ is typically for example $-0.95$ v, and $V_{OL}$ is typically, for example $-1.70$ v.

Figure 2:
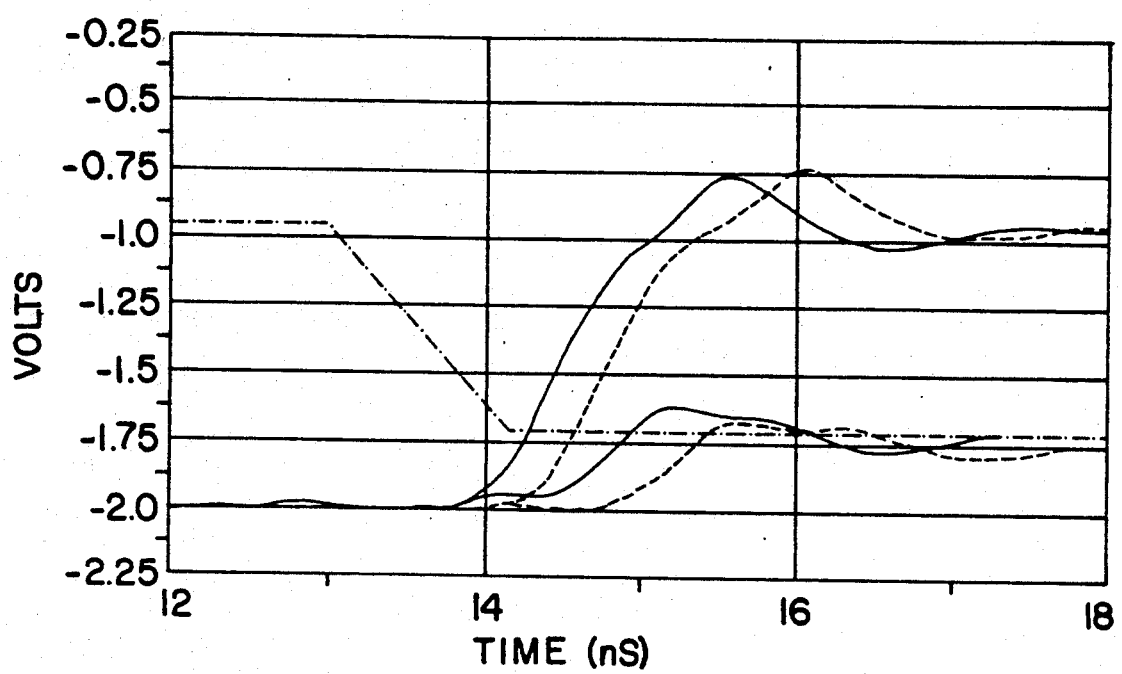
FIG. 2 is a simplified graph showing the "step out" or delay in transition at the output to ECL logic high and low potential levels $V_{OH}$, $V_{OL}$ from the cutoff state $V_{OLZ}$ for hot temperature operation QXHOT, QXNHOT at 125° C. in comparison with room temperature operation QX,QXN, following switching of the complementary output enable OE and OEN signals for the prior art circuit of FIG. 1.

It is therefore desirable that $V_{OLZ}$ be selected and specified to be slightly greater than $V_{TT}$, for example $-1.95$ v. As a result the output emitter follower transistor elements Q1 and Q4 are always slightly on for fast return from the cutoff state to the switching mode and for fast transition at the outputs QX and QXN from the cutoff potential level to the ECL logic high and low potential levels. It is this increment of voltage of $V_{OLZ}$ above $V_{TT}$ which is lost, however, in the hot temperature operating range with return of the step out or delay as illustrated in FIG. 2.

The clamp voltage level $V_{CL}$ is therefore selected to establish and maintain a minimum cutoff potential level $V_{OLZ}$ at the ECL outputs slightly greater than $V_{TT}$ across the high temperature operating range. To accomplish this, the clamp voltage level $V_{CL}$ at the output switching nodes V1 and V2 is set at a level of $1V_{BE}$ above the minimum specified cutoff voltage level $V_{OLZ}$ at the outputs QX and QXN. Thus the clamp voltage level $V_{CL}$ may be set at $-1.95$ v $+ V_{BE}$.

More generally the clamping voltage equation according to the invention is as follows:

$$V_{CL} > V_{TT} + V_{BE}.$$

Therefore, $$V_{CC} - V_{R7} - V_{BE} > V_{TT} + V_{BE}$$

solving for the voltage drop $V_{R7}$, across the clamp resistor element R7:

$$V_{R7} < V_{22} - 2V_{BE} - V_{TT}.$$

For typical values of ground 0v for $V_{CC}$, $-2.0$ v for $V_{TT}$, a hot temperature value of 0.7 v for $V_{BE}$, and 1.4 v for $2V_{BE}$, the value for $V_{R7}$ is indicated as follows:

$$V_{R7} < 0.6 \text{ v}.$$

This voltage drop level across clamp resistor element R7 may be set by selecting the current level generated by current sink I3 and the resistance value of resistor R7.

Figure 3A:
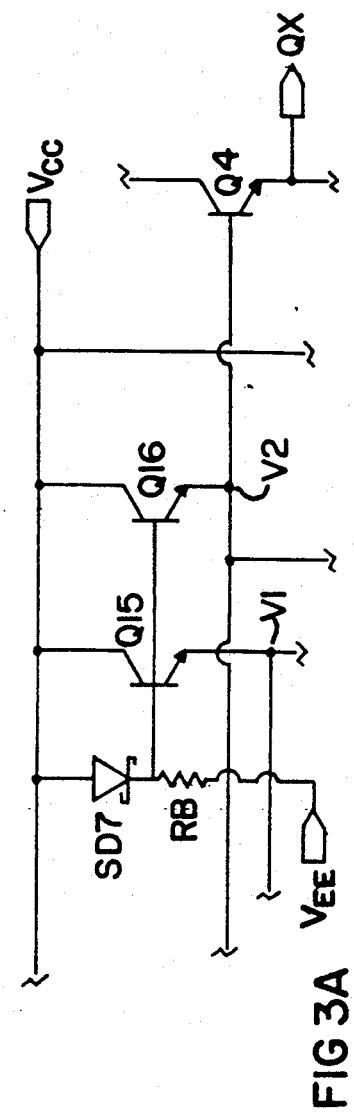
FIG. 3A is a fragmentary schematic circuit diagram showing an alternative embodiment of the cutoff driver clamp circuit.

According to an alternative example embodiment illustrated in FIG. 3A, the clamp resistor element R7 and clamp current sink I3 are replaced with a Schottky diode SD7 coupled in the clamp circuit at the same location as clamp resistor element R7. Schottky diode SD7 is coupled through bias resistor RB to the ECL low potential power rail $V_{EE}$ to maintain a substantially constant voltage drop across SD7. The cutoff clamp circuit is therefore provided by a diode stack circuit with first and second diode stack branches. The first diode stack branch is provided by Schottky diode SD7 and the PN diode provided by the base emitter junction of clamp transistor element Q15, coupled in series between the ECL high potential power rail $V_{CC}$ and the first output switching node V1. The second diode stack branch is provided by Schottky diode SD7 and the PN diode provided by the base emitter junction of clamp transistor element Q16, coupled in series between the ECL high potential power rail $V_{CC}$ and the second output node V2. The Schottky diode SD7, with a bias current established through SD7 and RB to $V_{EE}$, provides a substantially constant voltage drop $V_{SD7}$, substantially independent of current conducted through the clamp circuit. SD7 and RB coupled to $V_{EE}$ perform a function similar to the combination of clamp resistor element R7 with its clamp current sink I3. The slight dependence of the voltage drop $V_{SD7}$ with current due to series resistance of the Schottky diode is minimized by means of the bias current circuit through SD7 and RB to $V_{EE}$.

The cutoff clamp circuit utilizing the clamp resistor element R7 and clamp current sink I3 as illustrated in FIG. 3 provides the preferred example embodiment, however, because the constant voltage drop across clamp resistor element R7 may be continuously adjusted according to the other circuit parameters and the circuit application. The clamp circuit of FIG. 3 is not limited to the integral multiple of $V_{SD}$ and $V_{BE}$ voltage drops of a pure diode stack as shown in FIG. 3A.

The significance of emitter follower clamp transistor elements Q15 and Q16 is apparent upon analysis of the clamping action at output nodes V1, V2 during transition to the cutoff state. The initial downshift voltage excursion at output nodes V1 and V2 as the ECL gate transistor elements Q5 and Q6 turn off and the cutoff transistor elements Q8, Q9, Q10 and Q11 turn on, causes the emitter follower clamp transistor elements Q15 and Q16 to become slightly conducting with a small voltage drop $V_{BE}$ of, for example, 0.5 v across the respective base emitter junctions. As the current through swing resistor elements R1 and R2 increases to satisfy the current demand of the combined current sinks I1 and I2, the voltage level at output nodes V1 and V2 continues to fall and the current through emitter follower transistor elements Q15 and Q16 increases until the voltage drop $V_{BE}$ across the respective base emitter junctions reaches the hot temperature limit of, for example, 0.7 v. The clamping function is achieved by emitter follower transistor elements Q15 and Q16 displacing the sink current flow through swing resistor elements R1 and R2 so that the voltage level at output nodes V1 and V2 cannot fall below the clamping voltage level:

$$V_{CL} = V_{CC} - V_{R7} - V_{BE}.$$

In the hot temperature operating range of the cutoff driver circuit, for example at 125° C., the clamping voltage level $V_{CL}$ at output nodes V1 and V2, with $V_{CC}=0$, $V_{R7}=0.55$, and the hot temperature $V_{BE}=0.7$ v, is $-1.25$ v. This meets the requirement that $V_{CL}$ be equal to the $V_{OLE}$ value of $-1.95$ v plus the hot temperature $V_{BE}$ of 0.7 v or $-1.25$ v. This result also satisfies the inequality that the clamping voltage level $V_{CL} = -1.25$ v is greater than the terminating voltage $V_{TT} = -2.0$ v plus $1V_{BE}$ at 0.7 v or $-1.3$ v.

For the cold temperature range operation of the cutoff driver circuit, where $V_{CC}=0$ v, $V_{R7}=0.55$ v and the cold temperature $V_{BE}=0.9$ v, the clamping function is not necessary and the clamp effectively does not operate. Circuit conditions conform with the desired specification that $V_{OLZ}$ at the output be $-1.95$ v while the voltage level at output nodes V1 and V2 equals $V_{OLZ}$ plus the cold temperature $V_{BE}$ at 0.9 v or $-1.05$ v. The value of the current I2 is set so that:

$$(I1+I2)R1/2 = (I1+I2)R2/2 = 1.05 \text{ v}.$$

Figure 4:
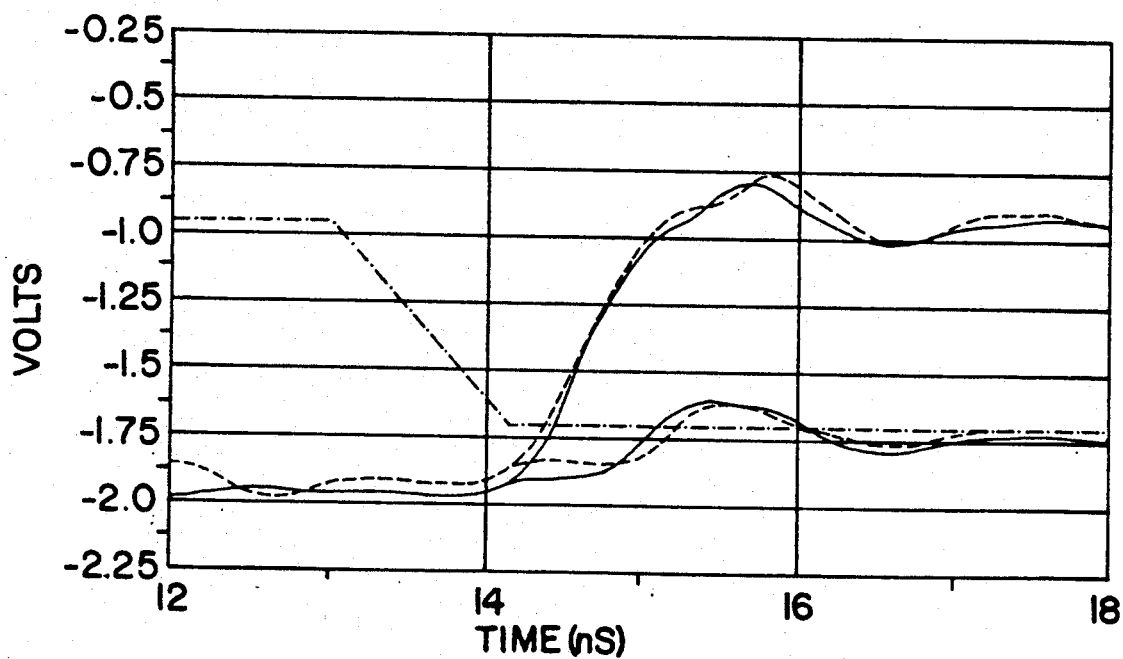
FIG. 4 is a simplified graph showing elimination of the "step out" or delay in transition at the outputs to valid ECL logic high and low potential levels from the cutoff state for the circuit of FIG. 3 comparing hot and cold temperature operation.

With the cutoff clamp circuit operation as set forth above and in FIG. 3, the "step out" or delay in transition from the cutoff state at the output to switching mode ECL logic high and low potential levels in the hot temperature operating range is substantially eliminated as illustrated in the graph of FIG. 4.

While the invention has been described with reference to particular example embodiments it is intended to cover all modifications and equivalents within the scope of the following claims.

I claim:

1. An ECL cutoff driver circuit for an ECL gate coupled between ECL high and low potential power rails, said ECL gate having differential input first and second gate transistor elements with differential signal inputs, said ECL gate having at least one output node (V1, V2) at a collector node of one of the first and second gate transistor elements, said output node being coupled to an ECL output (QXN, QX) by an output buffer transistor circuit for delivering ECL output signals of high and low potential levels $V_{OH}$ and $V_{OL}$ at the ECL output during operation of the ECL gate in a switching mode, said ECL cutoff driver circuit being operatively coupled to said output node for shifting down the ECL output to a cutoff potential level having a maximum upper value $V_{OLZ}$ in a cutoff state, said ECL cutoff driver circuit comprising:

cutoff clamp circuit means comprising voltage drop components operatively coupled in series between the ECL high potential power rail and said output node (V1, V2) for clamping the ECL output (QXN, QX) at a voltage level having a minimum lower value substantially at said cutoff voltage level $V_{OLZ}$ in the cutoff state for the fast return of the ECL gate to operation in the switching mode.

2. The ECL cutoff driver circuit of claim 1 wherein the cutoff clamp circuit means comprises a clamp resistor element and a clamp current sink operatively coupled in series between the ECL high and low potential power rails for generating a constant current and therefore a constant voltage drop across said clamp resistor element, said clamp resistor element comprising one of the voltage drop components coupled in series between the ECL high potential power rail and said output node.

3. The ECL cutoff driver circuit of claim 2 wherein the clamp circuit means comprises said clamp resistor element and a base emitter junction of a clamp transistor element operatively coupled in series between the ECL high potential power rail and said output node.

4. The ECL cutoff driver circuit of claim 3 wherein the clamp transistor element is coupled in emitter follower configuration with a collector node coupled to the ECL high potential power rail and a base node coupled to the clamp resistor element.

5. The ELC cutoff driver circuit of claim 1 wherein the cutoff clamp circuit means comprises a diode stack operatively coupled in series between the ECL high potential power rail and said output node.

6. The ECL cutoff driver circuit of claim 5 wherein the diode stack comprises a first diode element and a base emitter junction of a clamp transistor element operatively coupled in series.

7. The ECL cutoff driver circuit of claim 6 wherein the first diode element comprises at least one Schottky diode element and a bias current coupled between the Schottky diode element and said ECL low potential power rail.

8. The ECL cutoff driver circuit of claim 7 wherein the clamp transistor element is coupled in emitter follower configuration with a collector node coupled to the ECL high potential power rail and a base node coupled to the Schottky diode element.

9. The ECL cutoff driver circuit of claim 1 wherein the cutoff driver circuit includes an output enable gate comprising at least one cutoff transistor element operatively coupled between said output node and a common emitter node coupling and an OE transistor element operatively coupled between the ECL high potential power rail and said common emitter node coupling, said output enable gate having differential inputs for receiving complementary OE and OEN input signals, said cutoff transistor element being conducting in the cutoff state, and said OE transistor element being conducting during the switching mode, said cutoff clamp circuit means being operative during the cutoff state when the cutoff transistor element is conducting.

10. The ECL cutoff driver circuit of claim 3 wherein the output buffer transistor circuit comprises an emitter follower output buffer transistor element coupled to the output node of the ECL gate, said ECL output being coupled to the emitter node of said emitter follower output buffer transistor element with a terminating resistor element and termination voltage source $V_{TT}$ also being coupled to said emitter node, and wherein the cutoff clamp circuit means in the cutoff state is coupled to maintain a clamp voltage level $V_{OLZ}$ at said output node established by a voltage drop $V_{R7}$ across the clamp resistor element and a base emitter junction voltage drop $V_{BE}$, said clamp voltage level being slightly greater than the sum of the terminating voltage $V_{TT}$ plus $1V_{BE}$.

11. The ECL cutoff driver circuit of claim 1 wherein the first and second gate transistor elements of the ECL gate are coupled with a first common emitter node coupling and an ECL first current sink is coupled in a circuit between said first common emitter node coupling and the ECL low potential power rail;

wherein the cutoff driver circuit comprises a plurality of cutoff driver transistor elements operatively coupled at second and third common emitter node couplings, and a cutoff second current sink is operatively coupled between the third common emitter node coupling and the ECL low potential power rail, said second common emitter node coupling being coupled to the ECL first current sink;

said cutoff driver transistor elements comprising at least one output enable gate having at least one OE transistor element for operation of the ECL gate in the switching mode, said cutoff driver transistor elements being conducting in the cutoff state, and said cutoff clamp circuit means being operative in the cutoff state for clamping the minimum flower value of the voltage at the ECL output at said cutoff voltage level $V_{OLZ}$;

and wherein the cutoff clamp circuit means comprises a clamp resistor element and clamp third current sink operatively coupled in series between the ECL high and low potential power rails, said clamp third current sink generating a constant current through the clamp resistor element for establishing a constant voltage drop $V_{R7}$ across said clamp resistor element, and at least one base emitter junction of a clamp transistor element operatively coupled in series with said clamp resistor element in said cutoff clamp circuit means between the ECL high potential power rail and said output node.

12. The ECL cutoff driver circuit of claim 1 further comprising first and second swing resistor elements respectively coupled between the ECL high potential power rail and respective collector nodes of the first and second gate transistor elements, and a temperature compensating crossover network operatively coupled between said collector nodes of the first and second gate transistor elements, said temperature compensating crossover network being constructed for temperature compensation over a desired temperature range of operation of the ECL gate in the switching mode over the voltage range from $V_{OH}$ to $V_{OL}$, said cutoff clamp circuit means being constructed to prevent temperature induced voltage drop at the ECL output during the cutoff state below said specified minimum cutoff voltage level $V_{OLZ}$.

13. The ECL cutoff driver circuit of claim 11 comprising first and second output enable gates, said first output enable gate comprising at least one cutoff driver transistor element operatively coupled between said output node and ECL first current sink and a first OE transistor elements and said ECL first current sink for coupling the ECL gate to the first current sink during operation of the ECL gate int he switching mode and for disconnecting the ECL gate from the first current sink during the cutoff state.

14. The ECL cutoff driver circuit of claim 1 wherein the differential signal inputs are coupled respectively for receiving complementary direct and inverted input signals.

15. An ECL cutoff driver circuit for an ECL gate coupled between ECL high and low potential power rails $V_{CC}$ and $V_{EE}$, said ECL gate having differential input first and second gate transistor elements with differential signal inputs at respective base nodes and with a first common emitter node coupling, an ECL first current sink coupled in a circuit between said first common emitter node coupling and the ECL low potential power rail, said ECL gate having complementary output nodes (V1, V2) at respective collector nodes of the first and second gate transistor elements, said output nodes being coupled respectively through first and second emitter follower output buffer transistor elements to differential or complementary ECL outputs (QXN, QX) for delivering ECL output signals of ECL high and low potential levels $V_{OH}$ and $V_{OL}$ during operation of the ECL gate in a switching mode, said cutoff driver circuit comprising a plurality of cutoff driver transistor elements operatively coupled respectively to said complementary output nodes, at least one output enable gate comprising at least one of said cutoff transistor elements and a first OE transistor element coupled with a second common emitter node coupling and a cutoff second current sink operatively coupled between said second common emitter node coupling and the ECL low potential power rail, said first OE transistor element being coupled for conducting between the ECL high potential power rail and said cutoff second current sink during operation of the ECL gate in the switching mode, said cutoff driver transistor elements being conducting and shifting down the complementary ECL outputs to a cutoff potential level having a maximum upper value $V_{OLZ}$ in the cutoff state in response to OE or OEN signals, said ECL cutoff driver circuit comprising:

a cutoff clamp circuit having first and second cutoff clamp circuit branches each comprising voltage drop components respectively coupled in series between the ECL high potential power rail and one of said complementary output nodes (V1, V2) for clamping the complementary ECL outputs (QXN, QX) substantially at a voltage level having a minimum lower value $V_{OLZ}$ in the cutoff state for fast return of operation of the ECL gate to the switching mode upon turnoff of the cutoff transistor elements.

16. The ECL cutoff driver circuit of claim 15 wherein said cutoff clamp circuit comprises a clamp resistor element and a clamp third current sink operatively coupled in series between the ECL high and low potential power rails, said clamp third current sink generating a substantially constant current through the clamp resistor element for establishing a substantially constant voltage drop $V_{R7}$ across said clamp resistor element;

said first clamp circuit branch comprises at least one base emitter junction of a first clamp transistor element operatively coupled in series with the clamp resistor element between the ECL high potential power rail and one of the complementary output nodes (V1); and said second clamp circuit branch comprises at least one base emitter junction of a second clamp transistor element operatively coupled in series with the clamp resistor element between the ECL high potential power rail and the other of said complementary output nodes (V2).

17. The ECL cutoff driver circuit of claim 16 wherein the first and second clamp transistor elements are in emitter follower configurations with respective collector nodes coupled to the ECL high potential power rail and base nodes coupled in parallel to the clamp resistor element.

18. The ECL cutoff driver circuit of claim 15 further comprising first and second swing resistor elements respectively coupled between the ECL high potential power rail and respective collector nodes of the first and second gate transistor elements, and a temperature compensating crossover network operatively coupled between said collector nodes of the first and second gate transistor elements, said temperature compensating crossover network being constructed for temperature compensation over a desired temperature range of operation of the ECL gate in the switching mode over the voltage range from $V_{OH}$ to $V_{OL}$, said cutoff clamp circuit being constructed to prevent temperature induced voltage drop at the ECL output during the cutoff state below said specified minimum cutoff voltage level $V_{OLZ}$.

19. The ECL cutoff driver circuit of claim 15 wherein the cutoff clamp circuit comprises a diode stack circuit with first and second diode branches.

20. An ECL cutoff driver circuit for an ECL gate having differential input first and second gate transistor elements with differential signal inputs and at least one ECL output node (V1, V2) at a collector node of one of the first and second gate transistor elements coupled to an ECL output (QXN, QX) by an output buffer transistor circuit for delivering ECL output signals of high and low potential levels $V_{OH}$ and $V_{OL}$ at the ECL output during operation of the ECL gate in a switching mode, and at least one cutoff transistor element coupled to the ECL output node for shifting down the ECL output to a cutoff potential level having a maximum upper value $V_{OLZ}$ in a cutoff state, comprising:

cutoff clamp circuit means separate from the output buffer transistor circuit comprising voltage drop means coupled in series to said ECL output node (V1, V2) for clamping the ECL output (QXN, QX) to a voltage level having a minimum lower value substantially at said cutoff voltage level $V_{OLZ}$ in the cutoff state for fast return of the ECL gate to operation in the switching node;

said ECL gate being operatively coupled between ECL high and low potential power rails, said cutoff clamp circuit means being coupled between the ECL high potential power rail and the ECL output node for referencing operation of the cutoff clamp circuit means to the ECL high potential power rail.

21. The ECL cutoff driver circuit of claim 20 wherein the cutoff clamp circuit means comprises:

a clamp resistor element and a clamp current sink operatively coupled in series between the ECL high and low potential power rails, said clamp current sink generating a constant current through the clamp resistor element for establishing a constant voltage drop $V_{R7}$ across the clamp resistor element, and at least one clamp transistor element with a base emitter junction having voltage drop $V_{BE}$ coupled in series with said clamp resistor element between the ECL high potential power rail and said output node.

22. The ECL cutoff driver circuit of claim 21 wherein the clamp transistor element is in emitter follower configuration having a collector node coupled to the CL high potential power rail and a base node coupled to the clamp resistor element.

23. The ECL cutoff driver circuit of claim 20 wherein the cutoff clamp circuit comprises a diode stack.

24. The ECL cutoff driver circuit of claim 23 wherein the diode stack comprises a first diode element and at least one clamp transistor element with a base emitter junction having voltage drop $V_{BE}$ coupled in series with the first diode element between the ECL high potential power rail and said output node.

25. The ECL cutoff driver circuit of claim 24 wherein the clamp transistor element is coupled in emitter follower configuration.

26. The ECL cutoff driver circuit of claim 24 wherein the first diode element comprises at least one Schottky diode, and a bias current circuit coupled between the Schottky diode and said ECL low potential power rail.

* * * * *